United States Patent
Henry et al.

(10) Patent No.: US 7,663,957 B2
(45) Date of Patent: Feb. 16, 2010

(54) MICROPROCESSOR WITH PROGRAM-ACCESSIBLE RE-WRITABLE NON-VOLATILE STATE EMBODIED IN BLOWABLE FUSES OF THE MICROPROCESSOR

(75) Inventors: G. Glenn Henry, Austin, TX (US); Dinesh K. Jain, Austin, TX (US); Terry Parks, Austin, TX (US)

(73) Assignee: VIA Technologies, Inc., Taipei (TW)

( * ) Notice: Subject to any disclaimer, the term of this patent is extended or adjusted under 35 U.S.C. 154(b) by 126 days.

(21) Appl. No.: 12/141,387

(22) Filed: Jun. 18, 2008

(65) Prior Publication Data
US 2009/0296511 A1  Dec. 3, 2009

Related U.S. Application Data

(60) Provisional application No. 61/056,213, filed on May 27, 2008.

(51) Int. Cl.
  *G11C 17/18*  (2006.01)
(52) U.S. Cl. .............. 365/225.7; 365/189.08; 365/230.06
(58) Field of Classification Search ........... 365/225.7, 365/230.06, 189.08, 189.12, 239, 240
See application file for complete search history.

(56) References Cited

U.S. PATENT DOCUMENTS

| | | | |
|---|---|---|---|
| 5,790,783 A | 8/1998 | Lee et al. | |
| 5,946,497 A | 8/1999 | Lee et al. | |
| 7,242,615 B2 * | 7/2007 | Nagashima | 365/185.09 |
| 7,359,274 B2 * | 4/2008 | Noguchi et al. | 365/230.03 |

\* cited by examiner

*Primary Examiner*—Son Dinh
(74) *Attorney, Agent, or Firm*—E. Alan Davis; James W. Huffman

(57) ABSTRACT

A microprocessor includes re-writeable non-volatile state (RNS) addressable by an instruction executed by the microprocessor that instructs the microprocessor to write a new value to the RNS. A plurality of fuses are each readable to determine whether the fuse is blown or unblown, in response to the microprocessor decoding the instruction. A Boolean logic unit performs Boolean operations on the values read from the plurality of fuses to determine a current RNS value. A fuse blowing device blows at least one unblown fuse to change the current RNS value to the new value when the new value is different than the current value. The microprocessor can read the plurality of fuses, perform the Boolean operations, and blow at least one unblown fuse to change the current value of the RNS to a new value multiple times in response to a program running on the microprocessor executing the instruction multiple times.

38 Claims, 10 Drawing Sheets

| time | 0 | 1 | 2 | 3 | 4 | 5 |
|---|---|---|---|---|---|---|
| clock VF[2:0] | UUU | UUU | UUB | UUB | UBB | UBB |
| data VF[2:0] | UUU | UUB | UUB | UBB | UBB | BBB |
| VB value | 0 | 1 | 0 | 1 | 0 | 1 |

U = unblown; B = blown

| time | 0 | 1 | 2 | 3 | 4 | 5 |
|---|---|---|---|---|---|---|
| clock VF[2:0] | UUB | UUB | UBB | UBB | BBB | BBB |
| data VF[2:0] | UUU | UUB | UUB | UBB | UBB | BBB |
| VB value | 0 | 1 | 0 | 1 | 0 | 1 |

U = unblown; B = blown

MICROPROCESSOR WITH PROGRAM-ACCESSIBLE RE-WRITABLE NON-VOLATILE STATE EMBODIED IN BLOWABLE FUSES OF THE MICROPROCESSOR

CROSS REFERENCE TO RELATED APPLICATIONS

This application claims priority to Provisional Application No. 61/056,213, filed May 27, 2008, which is incorporated by reference herein in its entirety for all purposes.

BACKGROUND OF THE INVENTION

Field of the Invention

This invention relates in general to the field of microprocessors and particularly to storing non-volatile states within a microprocessor.

Traditionally, computer systems include various forms of re-writable non-volatile memory, such as tape, disk, CMOS, battery-backed, or FLASH memory. However, these resources are typically managed by system software, such as BIOS or the operating system, and are thus unavailable for some applications or for internal use by a microprocessor. Furthermore, these memories are outside the microprocessor of the system.

In order to provide serial numbers or other chip-specific information, microprocessors have provided a small amount of non-volatile random access memory (NVRAM) in the same package as the microprocessor core on a separate die from the microprocessor; the two die are connected by bond wires. See, for example, U.S. Pat. Nos. 5,790,783 and 5,946, 497 to Lee et al. However, this solution increases the cost of the package. Alternatively, the NVRAM could be fabricated on the same die as the microprocessor, such as may be found in some microcontrollers; however, this requires additional oxide layers on the die to include the NVRAM which may also increase the package cost.

There are various situations in which it would be useful to have non-volatile state within a microprocessor itself that may be written and read multiple times by programs, such as system software. However, as mentioned above, to fabricate NVRAM, such as FLASH memory, onto a microprocessor is expensive, and including a separate NVRAM on a separate die within the same package as the microprocessor is also expensive. Furthermore, for many applications, the amount of state needed is relatively small. Therefore, what is needed is a microprocessor that includes non-volatile state that is re-writable by system software.

SUMMARY

The present invention includes a microprocessor that provides one or more non-volatile bits of state embodied as a plurality of fuses. Each non-volatile bit can be written multiple times in the field under program control during operation of the microprocessor and be read back by the program such that the fuses appear to the program as a re-writeable non-volatile state (RNS). In this way, the non-volatile bits function similar to a FLASH memory, with a limited number of allowable write occurrences.

In one aspect, the present invention provides a microprocessor including a re-writeable non-volatile state (RNS) that is addressable by an instruction executed by the microprocessor that instructs the microprocessor to write a new value to the RNS. After the microprocessor decodes the instruction, a plurality of fuses are each readable by the microprocessor to determine whether the fuse is blown or unblown. Each of the plurality of fuses provides a first Boolean value when read if blown and a second Boolean value when read if unblown. The plurality of fuses are initially unblown. A Boolean logic unit is coupled to the plurality of fuses and is configured to perform Boolean operations on the values read from the plurality of fuses in order to determine a current value of the RNS. A fuse blowing device is coupled to the plurality of fuses and is configured to blow at least one unblown fuse of the plurality of fuses to change the current value of the RNS to the new value specified by the instruction when the new value is different than the current value of the RNS. In response to a program running on the microprocessor executing the instruction multiple times, the microprocessor is configured to read the plurality of fuses, perform the Boolean operations, and blow at least one unblown fuse to change the current value of the RNS to a new value multiple times.

In another aspect, the present invention provides a method for a microprocessor to write a new value to a re-writeable non-volatile state (RNS) that is addressable by an instruction executed by the microprocessor. The method includes reading a plurality of fuses by the microprocessor to determine whether the fuse is blown or unblown, in response to the microprocessor decoding the instruction. Each of the plurality of fuses provides a first Boolean value when read if blown and a second Boolean value when read if unblown. The plurality of fuses are initially unblown. The method also includes performing Boolean operations by a Boolean logic unit on the values read from the plurality of fuses in order to determine a current value of the RNS. The method also includes blowing at least one unblown fuse of the plurality of fuses by a fuse blowing device to change the current value of the RNS to the new value specified by the instruction when the new value is different than the current value of the RNS. The method also includes performing the step of reading, the step of performing Boolean operations, and the step of blowing at least one unblown fuse to change the current value of the RNS to a new value multiple times in response to a program running on the microprocessor executing the instruction multiple times.

In another aspect, the present invention provides a microprocessor including a re-writeable non-volatile state (RNS). In response to detecting a predetermined condition, a plurality of fuses readable by the microprocessor determines whether the fuse is blown or unblown. Each of the plurality of fuses provides a first Boolean value when read if blown and a second Boolean value when read if unblown. The plurality of fuses are initially unblown. A Boolean logic unit is coupled to the plurality of fuses, and is configured to perform Boolean operations on the values read from the plurality of fuses in order to determine a current value of the RNS. A fuse blowing device is coupled to the plurality of fuses, and is configured to blow at least one unblown fuse of the plurality of fuses to change the current value of the RNS to the new value specified by the predetermined condition, when the new value is different than the current value of the RNS. In response to detecting a predetermined condition multiple times when the new value is different than the current value, the microprocessor is configured to read the plurality of fuses, perform the Boolean operations, and blow at least one unblown fuse to change the current value of the RNS to a new value multiple times.

In another aspect, the present invention provides a method for a microprocessor to write a new value to a re-writeable non-volatile state (RNS) that is addressable by the microprocessor. The method includes reading a plurality of fuses by the microprocessor to determine whether the fuse is blown or unblown, in response to detecting a predetermined condition. Each of the plurality of fuses provides a first Boolean value when read if blown and a second Boolean value when read if unblown. The plurality of fuses are initially unblown. The method also includes performing Boolean operations by a Boolean logic unit on the values read from the plurality of fuses in order to determine a current value of the RNS. The method also includes blowing at least one unblown fuse of the plurality of fuses by a fuse blowing device to change the current value of the RNS to a new value when the new value is different than the current value of the RNS. The method also includes performing the step of reading, the step of performing Boolean operations, and the step of blowing at least one unblown fuse to change the current value of the RNS to a new value multiple times in response to detecting a predetermined condition multiple times.

In another aspect, the present invention provides a microprocessor including re-writeable non-volatile state (RNS) that is addressable by an instruction executed by the microprocessor that instructs the microprocessor to write a new value to the RNS. The microprocessor includes a plurality of virtual fuses, each comprising a plurality of physical fuses. Each physical fuse is readable by the microprocessor to determine whether the physical fuse is blown or unblown. The microprocessor Boolean ORs the plurality of physical fuses to generate a first Boolean value of the virtual fuse when read, if at least one of the plurality of physical fuses is blown and a second Boolean value when read if none of the plurality of physical fuses are blown. The plurality of physical fuses are initially unblown. The microprocessor includes a plurality of virtual bits, each comprising a plurality of virtual fuses. The microprocessor Boolean XORs the plurality of virtual fuses to generate the value of the virtual bit. The microprocessor includes a virtual word comprising the plurality of virtual bits. The microprocessor is configured to perform Boolean operations on the values read from the plurality of physical fuses in order to determine a current value of the virtual word, to compare each bit of the virtual word to each bit of the new value being written by the instruction, and to blow at least one unblown fuse of the plurality of physical fuses to change the current value of the virtual word to the new value specified by the instruction, when the new value is different than the current value of the virtual word.

An advantage of the microprocessor with a fuse-embodied re-writable non-volatile state as described herein is that it is potentially less expensive than fabricating a FLASH memory on the microprocessor die and than including a FLASH memory on a separate die within the same package as the microprocessor. Another advantage is that it does not require external NVRAM outside the microprocessor package that is more susceptible to security breaches such as reprogramming by de-soldering from a printed circuit board, reprogramming, and re-soldering back onto the printed circuit board. Another security advantage of the fact that the fuse-embodied re-writable non-volatile state is internal to the microprocessor is that the microprocessor may access the fuse-embodied state before fetching and executing any code eternal to the microprocessor to determine whether the microprocessor should enter a degraded performance state or even disable itself by refraining from fetching and executing external code altogether.

Other features and advantages of the present invention will become apparent upon study of the remaining portions of the specification and drawings.

DETAILED DESCRIPTION

Figure 1:
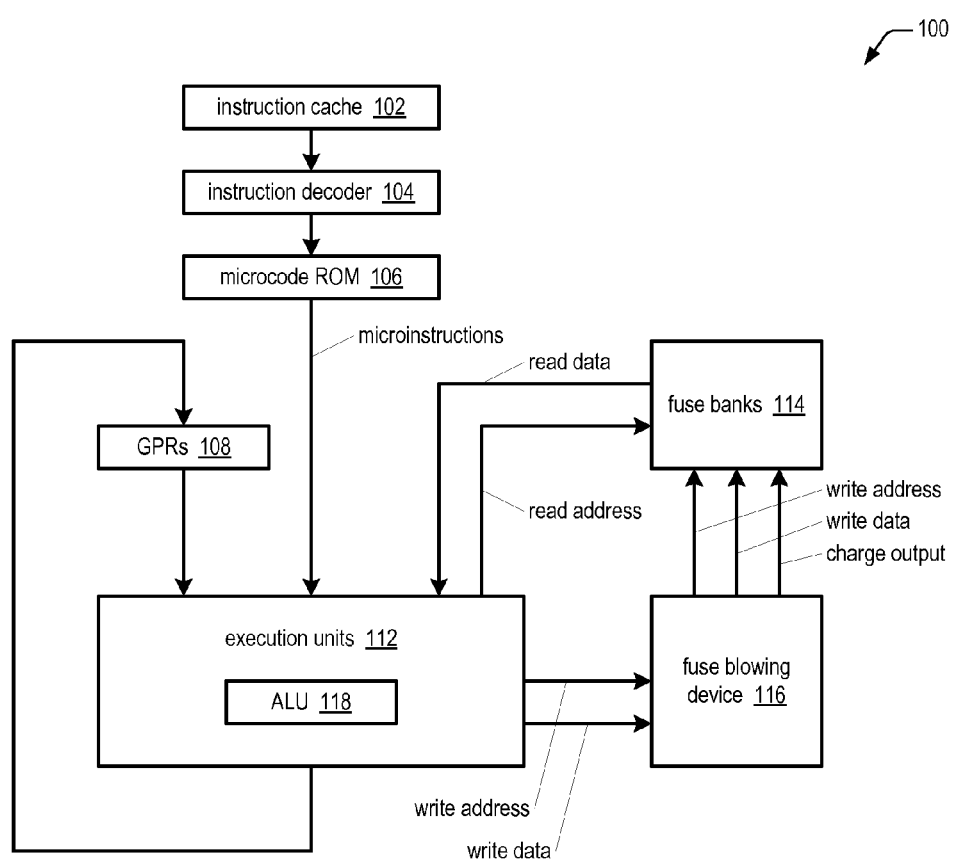
FIG. 1 is a block diagram illustrating a microprocessor according to the present invention.

Referring now to FIG. 1, a block diagram illustrating a microprocessor 100 according to the present invention is shown. The microprocessor 100 includes an instruction cache 102, an instruction decoder 104, a microcode ROM 106, general purpose registers 108, and execution units 112, as shown, in addition to other functional units not shown. Additionally, the microprocessor 100 includes banks of fuses 114 and a fuse blowing device 116, coupled to the fuse banks 114, which is capable of individually addressing and blowing individual fuses within the fuse banks 114. The execution units 112 of microprocessor 100 provide the write address and write data to the fuse blowing device 116, and the fuse blowing device buffers the write address and write data to the fuse banks 114. The fuse blowing device 116 also provides a charge output to fuse banks 114 to blow fuses. Read data is supplied by fuse banks 114 to execution units 112, in response to a read address supplied by execution units 112 to fuse banks 114. The fuse banks 114 and fuse blowing device 116 are employed to provide fuse-embodied re-writable non-volatile state (FERNS) available to programs executing on the microprocessor 100 as described herein.

Fuses in the fuse banks 114 are distinguished from memory cells. Although both a fuse and a memory cell can store a binary state, a fuse is different from a memory cell in that after a fuse has been changed from its default state (unblown, i.e., conducting) to its alternate state (blown, i.e., non-conducting), the fuse cannot be restored to its default state (i.e., from blown to unblown). In contrast, a memory cell can be changed between its default and alternate state and back to its default state multiple times. For example, an EPROM or EEPROM cell can be changed from its default state to an alternate state and then the same physical cell can be changed back to its default state via ultraviolet light or an electric field, respectively, and this cycle from default to alternate to default state can be performed multiple times. In contrast, once a physical fuse is blown, that same fuse cannot be unblown. Depending on what the input side of the fuse is connected to and the fuse design, a blown fuse may be read as either a binary '0' or binary '1' and an unblown fuse may be read as a binary '1' or '0', respectively.

The instruction cache 102 caches program instructions. In one embodiment, the program instructions comprise x86 architecture instructions, which include the WRMSR and RDMSR instructions used to write and read model specific registers (MSR) of the microprocessor 100. The WRMSR and RDMSR instructions specify via the ECX register the address within the MSR address space of the MSR to be written or read. Thus, the WRMSR and RDMSR instructions employ their own address space (referred to herein as the MSR address space). In one embodiment, the FERNS occupy an address range within the MSR address space.

The program loads the data to be written to the addressed MSR by the WRMSR instruction in the EDX:EAX registers and receives the data read from the addressed MSR by the RDMSR instruction in the EDX:EAX registers. The instruction decoder 104 decodes program instructions fetched from the instruction cache 102. In particular, when the instruction decoder 104 encounters a WRMSR or RDMSR instruction, it invokes a routine in the microcode ROM 106 to perform the instruction. As described below, if the WRMSR or RDMSR instruction addresses an MSR in the FERNS address range, then the microcode routine performs steps to read and/or blow fuses 114 and to cause the execution units 112 to manipulate the values read from the fuses 114 as described herein. In one embodiment, the behavior of a WRMSR instruction that specifies an address in the FERNS address range is slightly different than a conventional WRMSR instruction in that the WRMSR instruction generates an exception (such as an x86 machine check (#MC) exception) if the microprocessor 100 is unsuccessful in performing the instruction, such as if no fuses within the fuse banks 114 were available to be blown in order to update the FERNS to the new value.

In one embodiment, the fuse blowing device 116 is a charge pump that accumulates charge on capacitors and releases sufficient charge to the fuse input to blow the fuse. However, it should be understood that the fuse blowing device encompasses other embodiments that are capable of blowing fuses within a microprocessor.

In an alternate embodiment, rather than being written by a program instruction, the microprocessor itself updates the FERNS in response to detecting a predetermined condition or event. For example, the microprocessor 100 may continuously monitor an internal condition such as the microprocessor 100 die temperature or an error count, such as a memory error count and when the temperature or error count exceeds a threshold, the microprocessor 100 blows one or more fuses of the FERNS to update its value, perhaps by incrementing the FERNS value. In this way, the FERNS functions as a non-volatile counter that stores the number of times the threshold was exceeded. If the non-volatile counter exceeds a predetermined threshold, the microprocessor 100 may take an appropriate action, such as sending a message or disabling all or a portion of the microprocessor 100.

Figure 2:
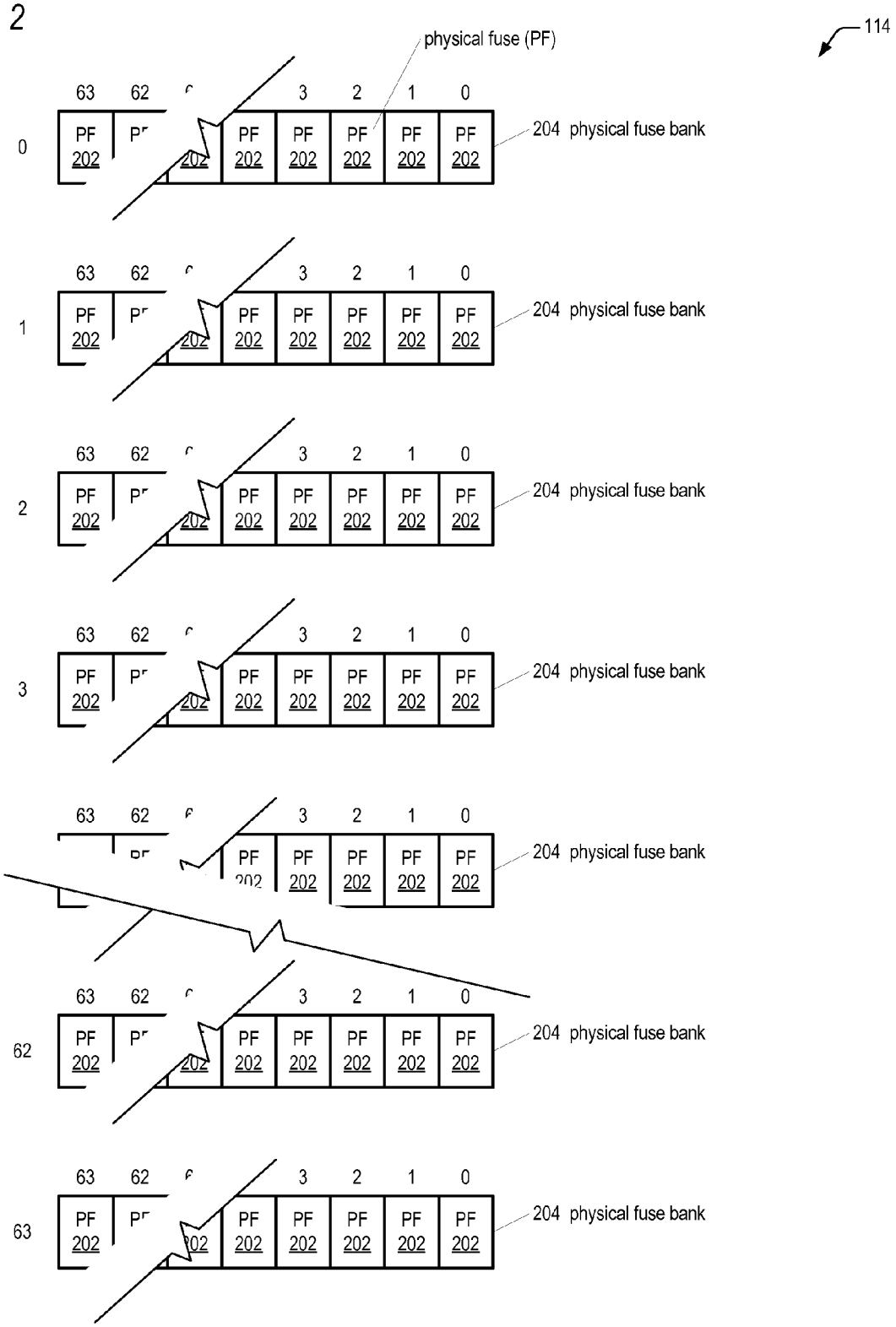
FIG. 2 is a block diagram illustrating the fuse banks of FIG. 1.
Figure 7:
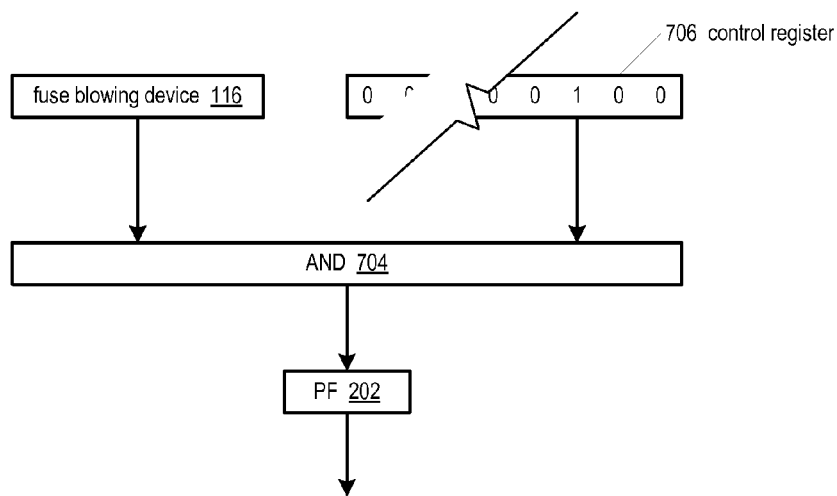
FIG. 7 is a block diagram illustrating the interface to the physical fuse banks of FIG. 2.

Referring now to FIG. 2, a block diagram illustrating the fuse banks 114 of FIG. 1 is shown. In the embodiment of FIG. 2, the microprocessor 100 includes 64 physical fuse banks 204, each physical fuse bank 204 having 64 physical fuses (PF) 202, each PF 202 individually blowable by the fuse blowing device 116. In one embodiment, a microinstruction can read the value of all 64 of the PFs 202 from a physical fuse bank 204 and write the values into a temporary register of the microprocessor 100 for manipulation by other microcode instructions. FIG. 7 describes in more detail the interface to the physical fuse banks 204. The PFs 202 are relatively inexpensive in terms of integrated circuit die area because they can be placed in unused space on the die footprint after layout of the functional units is performed. By convention according to one embodiment, when the microprocessor 100 reads a non-blown PF 202 the value is a binary 0, which is the default value, and when the microprocessor 100 reads a blown PF 202, which is the alternate value, the value is a binary 1.

Figure 3:
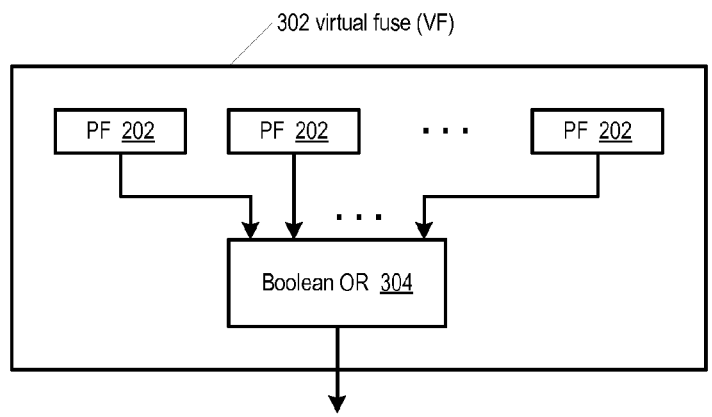
FIG. 3 is block diagram illustrating the notion of a virtual fuse (VF) comprising a plurality of PFs of the physical fuse banks of FIG. 2.

Referring now to FIG. 3, a block diagram illustrating the notion of a virtual fuse (VF) 302 comprising a plurality of PFs 202 of the physical fuse banks 204 of FIG. 2 is shown. Blowing PFs 202 may be relatively unreliable. Therefore, according to one embodiment, a VF 302 incorporates PF 202 redundancy in case a blow of a PF 202 was unsuccessful. The value of a VF 302 when read is the Boolean OR 304 of the plurality of PFs 202 associated with the VF 302. In one embodiment, the logical OR function is performed by hardware in the processor. In another embodiment, the logical OR function is performed by microcode instructions. That is, the microcode first simply reads the values of the PFs 202 from one or more physical fuse banks 204 into temporary registers. Then, the microcode logical OR's the PF 202 values associated with the VF 302 to generate the VF 302 value. Thus, the default value of a VF 302 is a binary 0, since the default value of a PF 202 is a binary 0. In one embodiment, when the microprocessor 100 attempts to "blow" a VF 302, the microprocessor 100 physically blows all of the PFs 202 associated with a VF 302. Thus, due to the Boolean OR'ing of the PFs 202 associated with a VF 302, as long as at least one PF 202 was successfully blown, the VF 302 will have the correct value (i.e., a binary 1 value) when read.

In one embodiment, when the microprocessor 100 wants to blow a VF 302, it instructs the fuse blowing device 116 to sequentially blow the PFs 202 that make up a VF 302. In an alternate embodiment, the microprocessor 100 instructs the fuse blowing device 116 to simultaneously blow the PFs 202 that make up a VF 302. In one embodiment, rather than blowing all the PFs 202 that make up a VF 302, the microprocessor 100 may blow only a single PF 202 and then verify that the PF 202 was successfully blown. If so, the microprocessor 100 does not bother to blow the remaining PFs 202 of the VF 302; otherwise, the microprocessor 100 attempts to blow the next PF 202 of the VF 302 and repeats the process until a PF 202 is successfully blown and verified. This embodiment has the potential advantage of being faster and less power consuming than the embodiment in which the microprocessor 100 simply blows all the PFs 202 of the VF 302.

Figure 4:
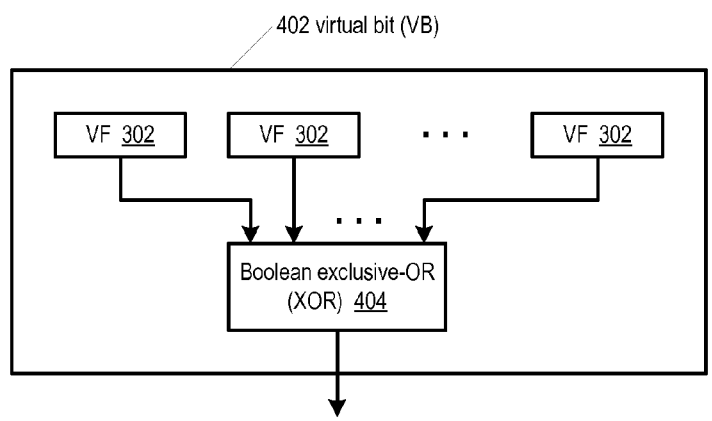
FIG. 4 is a block diagram illustrating the notion of a virtual bit (VB) comprising a plurality of VFs of FIG. 3.

Referring now to FIG. 4, a block diagram illustrating the notion of a virtual bit (VB) 402 comprising a plurality of VFs 302 of FIG. 3 is shown. The VB 402 provides the re-writable characteristic of FERNS. The value of a VB 402 when read is the Boolean exclusive-OR (XOR) 404 of the plurality of VFs 302 associated with the VB 402. In one embodiment, the logical XOR is performed by hardware. In another embodiment, the logical XOR is performed by microcode instructions. That is, the microcode Boolean XOR's the values of the VFs 302 associated with the VB 402 to generate the VB 402 value. Thus, the default value of a VB 402 is a binary 0. When a program instruction instructs the microprocessor 100 to write a binary value to a VB 402, the microprocessor 100 first reads the VB 402 to determine whether the current value is different than the value to be written. If so, the microprocessor 100 blows the next unblown VF 302 associated with the VB 402 to toggle its value. This action will toggle the VB 402 value because of the characteristic of the XOR function. If the current value is the same as the value to be written, the microprocessor 100 does not blow any PFs 202. By not blowing PFs 202 when unnecessary, PFs 202 may be preserved and the number of writes to a FERNS VB 402 may be increased. A write to a VB 402 of FERNS (such as a WRMSR instruction specifying an address in the FERNS range of the MSR address space or a write initiated internally by the microprocessor 100 itself in response to detecting an event or predetermined condition) that requires a change in the bit value (i.e., a write of a 1 to a bit of FERNS that currently has a 0 value, or a write of a 0 to a bit of FERNS that currently has a 1 value), is referred to herein as a toggling write. As may be observed, the number of times that a VB 402 may be written via a toggling write is equal to the number of VFs 302 that are associated with a VB 402 (or in the case of variable allocation, such as the embodiment of FIGS. 12 and 13, the number of data VFs 1204 that are associated with a VB 402). The number of VFs 302 associated with a VB 402 may be fixed or variable, as described below.

Figure 5:
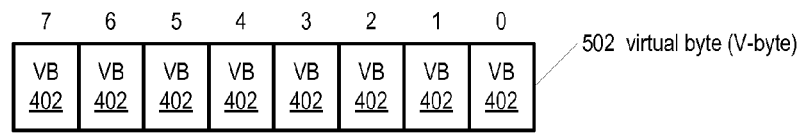
FIG. 5 is a block diagram illustrating data types of the programming interface provided by the FERNS feature.
Figure 5:
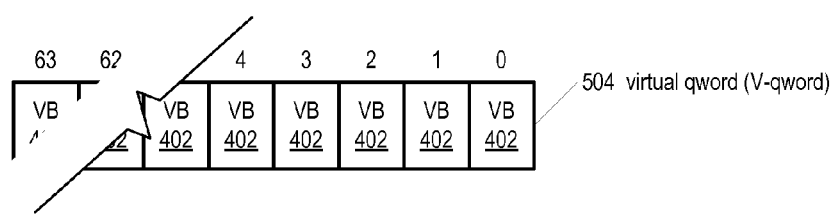

Referring now to FIG. 5, a block diagram illustrating data types of the programming interface provided by the FERNS feature is shown. The VBs 402 of FIG. 4 are the basic building blocks of the FERNS data types provided to programs. According to various embodiments, FERNS may provide to programs a single VB 402 (as shown in FIG. 4) and/or a plurality of VBs 402, such as eight VBs 402 that form a virtual byte 502 (V-byte, as shown in FIG. 5), 16 VBs 402 that form a virtual word (not shown), 32 VBs 402 that form a virtual dword (not shown), or 64 VBs 402 that form a virtual qword (V-qword, as shown in FIG. 5), for example. However, it should be noted that any number of VBs 402 may be used to construct the programming interface provided by the FERNS, as needed. In the case of a V-byte 502 data type provided by the programming interface, the values read from the eight VBs may be binary encoded to represent an unsigned decimal value from 0 to 256, or a signed decimal value of −128 to +127, for example.

There are several configurable parameters associated with the FERNS subsystem. The first is the number of PFs 202 that make up a VF 302, which affects the reliability of blowing a VF 302. The second is the number of VFs 302 that make up a VB 402, which affects the number of times a VB 402 may be re-written. The third is the amount of time to charge the fuse blowing device 116 (e.g., charge pump) before attempting to blow a PF 202, which affects the reliability of blowing a PF 202. The fourth is the amount of time to allow the fuse blowing device 116 to discharge to the PF 202 input when blowing the PF 202, which also affects the reliability of blowing a PF 202. The fifth is the maximum number of PF 202 blow retry attempts. The sixth is the maximum number of PFs 202 that the microprocessor 100 attempts to blow at a time.

One characteristic of PFs 202 is that if a PF 202 appears blown upon reading, then it has been blown, i.e., its binary value has changed. On the other hand, if a PF 202 appears unblown, the microprocessor 100 may or may not have attempted to blow the PF 202. Furthermore, the PF 202 may appear blown another time when subsequently read. Embodiments are contemplated in which the number of PFs 202 associated with a VF 302 is variable, rather than fixed. That is, each time a VF 302 needs to be toggled, the microprocessor 100 attempts to blow a PF 202 associated with the VF 302. If the blow of the single PF 202 is verified as successful, then the operation is complete; however, if the blow of the single PF 202 is not verified as successful (after the configured number of retries), the microprocessor 100 allocates another PF 202 to associate with the VF 302 and attempts to blow the newly allocated PF 202.

Figure 6:
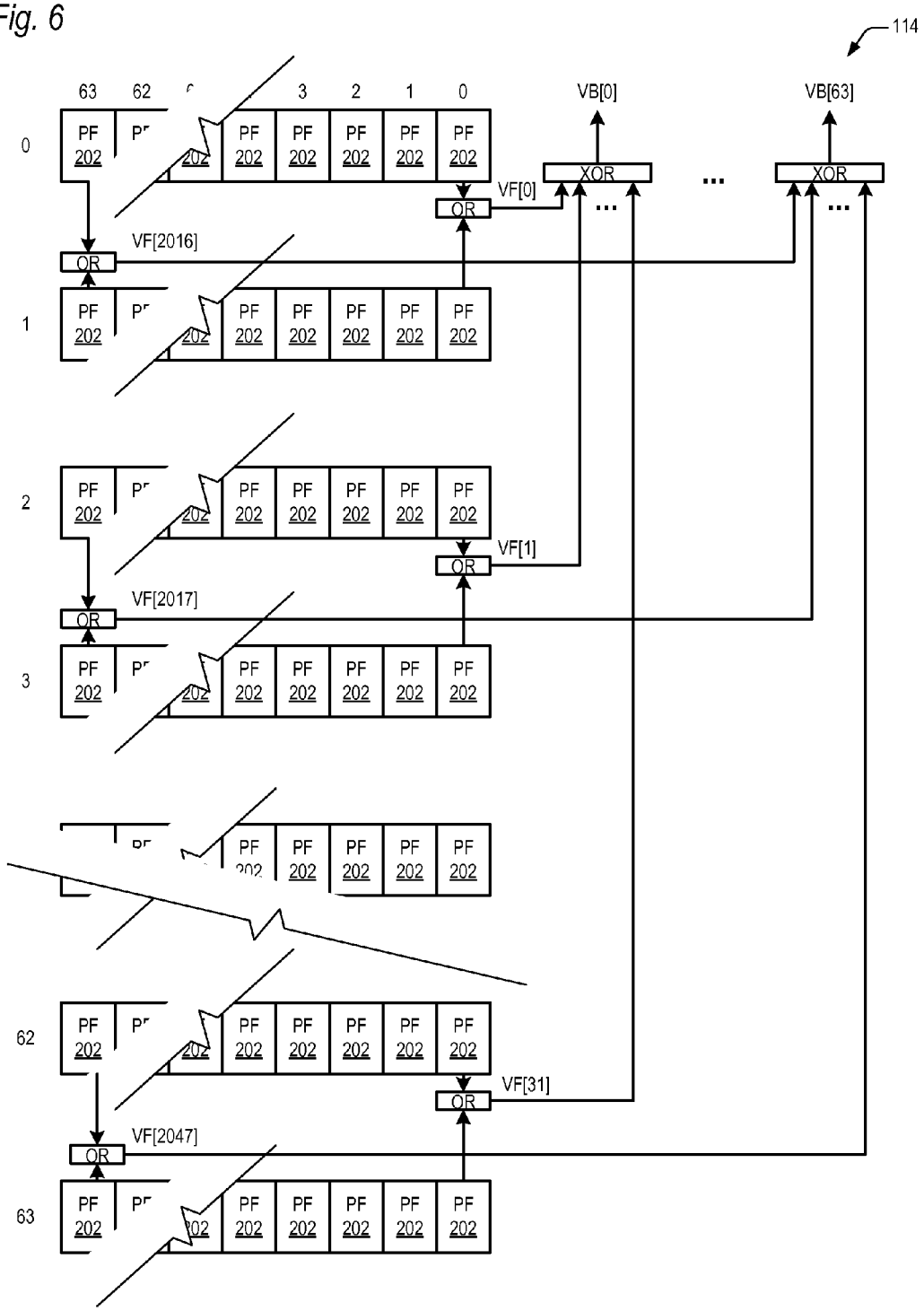
FIG. 6 is a block diagram illustrating one embodiment of a fixed scheme of allocating the PFs of the fuse banks of FIG. 1 to provide a FERNS subsystem.

Referring now to FIG. 6, a block diagram illustrating one embodiment of a fixed scheme of allocating the PFs 202 of the fuse banks 114 of FIG. 1 to provide a FERNS subsystem is shown. Each VF 302 is made up of a fixed number of PFs 202 and each VB 402 is made up of a fixed number of VFs 302. In particular, each VF 302 is made up of two PFs 202 and each VB 402 is made up of 32 VFs 302, thus allowing each VB 402 to be the target of a toggling write up to 32 times. There are a total of 2048 VFs 302, as shown. In the embodiment of FIG. 6, VF[0] 302 is the Boolean OR of PF[0] 202 of physical bank[0] 204 and PF[0] 202 of physical bank[1] 204; VF[1] 302 is the Boolean OR of PF[0] 202 of physical bank[2] 204 and PF[0] 202 of physical bank[3] 204; and so forth to VF[31] 302 which is the Boolean OR of PF[0] 202 of physical bank[62] 204 and PF[0] 202 of physical bank[63] 204; this pattern continues up to VF[2016] 302 which is the Boolean OR of PF[63] 202 of physical bank[0] 204 and PF[63] 202 of physical bank[1] 204; VF[2017] 302 is the Boolean OR of PF[63] 202 of physical bank[2] 204 and PF[63] 202 of physical bank[3] 204; and so forth to VF[2047] 302 which is the Boolean OR of PF[63] 202 of physical bank[62] 204 and PF[63] 202 of physical bank[63] 204. VB[0] is the Boolean XOR of VF[31:0]; VB[1] is the Boolean XOR of VF[63:32]; and so forth to VB[63] which is the Boolean XOR of VF[2047:2016]. Thus, a total of 64 VBs 402 are provided from 2048 VFs 302 that are provided from the 4096 PFs 202 of the embodiment of FIG. 6. The particular grouping of PFs 202 and VFs 302 in the embodiment of FIG. 6 is particularly beneficial for implementation in microcode since it requires a relatively small number of shift operations relative to other schemes; however, the embodiment requires a read of all 64 of the fuse banks 114, which may be relatively more than other embodiments depending upon the presentation of the 64 VBs 402 to the program interface (discussed below). Other groupings of PFs 202 and VFs 302 are contemplated. For example, an embodiment is contemplated in which adjacent PFs 202 within a fuse bank 114 are Boolean OR'ed to generate a VF 302, and the VFs 302 within a fuse bank 114 are XOR'ed to generate a VB 402. This embodiment may have the advantage of fewer reads of the fuse banks 114 (depending upon the program interface presented) in exchange for a relatively larger number of shift operations required to perform the Boolean OR and XOR operations.

Various embodiments are contemplated for the presentation of the 64 VBs 402 of FIG. 6 to the program interface. For example, the microprocessor 100 may present the 64 VBs 402 as a single 64-bit wide MSR; two 32-bit wide MSRs; four 16-bit wide MSRs; eight 8-bit wide MSRs; or 64 single-bit MSRs. In either case, each MSR can be the target of 32 toggling writes. Other embodiments are contemplated in which the microprocessor 100 presents the 64 VBs 402 as a combination of different width data type MSRs.

Referring now to FIG. 7, a block diagram illustrating the interface to the physical fuse banks 204 of FIG. 2 is shown. The input side of each PF 202 is connected to the output of a two-input AND gate 704. When a PF 202 is being read, the fuse blowing device 116 output is connected to GND. When a PF 202 is being written, the AND gate 704 receives on one input the output of the fuse blowing device 116 of FIG. 1. The AND gate 704 receives on its other input a bit from a control register 706. The control register 706 is the width of a physical fuse bank 204, and the bit received by the AND gate 704 is the bit within the control register 706 that corresponds to the bit position of the PF 202 within its physical fuse bank 204. Thus, when the PF 202 is being written, i.e., blown, microcode can select the particular PF 202 within a physical fuse bank 204 to blow by writing a binary 1 to the specific bit of control 706 corresponding to the PF 202 to be blown.

In one embodiment, the microprocessor 100 also includes other control registers writable by microcode to control selection logic that enables microcode to select which of the physical fuse banks 204 is to be read or written. Additionally, the microprocessor 100 includes a control register writable by microcode to control charging of the fuse blowing device 116 and releasing of the charge accumulated on the fuse blowing device 116 for blowing a PF 202. Thus, by writing the control registers, microcode can individually blow any individual PF 202 and can read an entire physical fuse bank 204. Embodiments are also contemplated in which the microcode can blow multiple PFs 202 at a time, if the fuse blowing device 116 is sufficiently powerful, by writing a binary 1 value to multiple bits of the control register 706. In one embodiment, the control registers are populated via a serial scanning mechanism, such as a JTAG mechanism.

Figure 8:
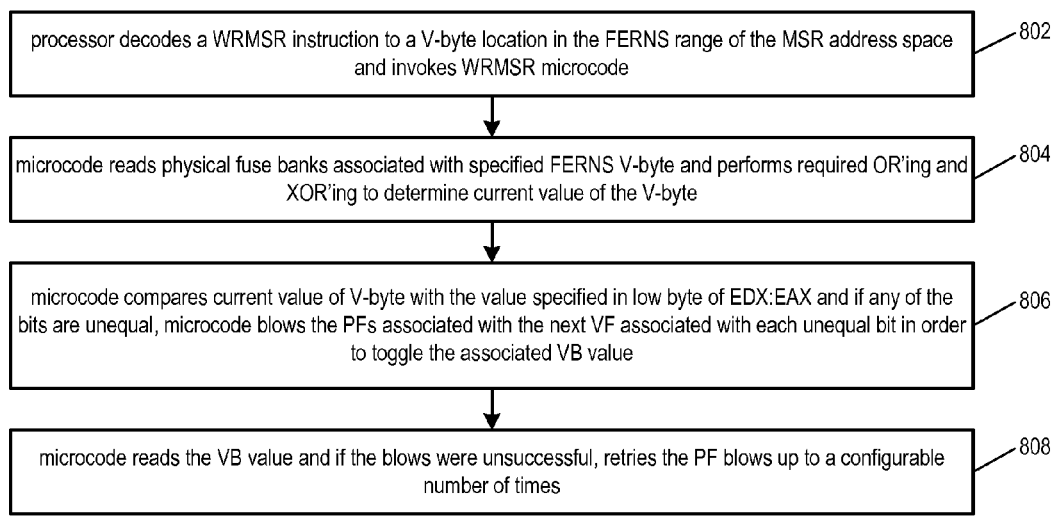
FIG. 8 is a flowchart illustrating operation of the microprocessor to execute a WRMSR instruction to a location in the FERNS range of the MSR address space.

Referring now to FIG. 8, a flowchart illustrating operation of the microprocessor 100 to execute a WRMSR instruction to a location in the FERNS range of the MSR address space is shown. The description in FIG. 8 assumes the program is presented with a V-byte 502 data type, i.e., each WRMSR instruction accessing a location in the FERNS range accesses a single byte of data. Flow begins at block 802.

At block 802, the microprocessor 100 fetches from the instruction cache 102 a WRMSR program instruction, and the instruction decoder 104 decodes the WRMSR instruction and invokes the WRMSR microcode routine. Flow proceeds to block 804.

At block 804, the WRMSR microcode routine determines that the MSR address (specified in the ECX register) specifies a location in the FERNS range of the MSR address space, and writes the control registers appropriately to read the one or more physical fuse banks 204 that contain the PFs 202 associated with the FERNS V-byte 502 specified by the MSR address. The microcode then performs the necessary Boolean OR operations to generate the VF 302 values associated with the V-byte 502 specified by the MSR address. The microcode then performs the necessary Boolean XOR operations to generate the VBs 402 of the V-byte 502. Flow proceeds to block 806.

At block 806, the microcode compares the current V-byte 502 value generated at block 804 with the value to be written as specified by the WRMSR instruction, i.e., the value contained in the low byte of the EDX:EAX registers. If any of the bits are unequal, then the microcode writes the control registers appropriately to blow the PFs 202 associated with the next available (i.e., unblown) VF 302 associated with each unequal bit in order to toggle the associated unequal VB 402 of the V-byte 502. The microcode allows the fuse blowing device 116 to charge an amount of time specified by the associated configurable value and allows the fuse blowing device 116 to discharge to the PF 202 input an amount of time specified by the associated configurable value. In one embodiment the microprocessor 100 is capable of operating at multiple operating voltage levels (commonly referred to as P-states). The microprocessor 100 transitions to the highest P-state (i.e., highest operating voltage level) prior to blowing the PFs 202 in order to decrease the amount of time required to accumulate sufficient charge on the fuse blowing device 116 to blow the PFs 202. After the PFs 202 are blown, the microprocessor 100 transitions back to the previous P-state. Flow proceeds to block 808.

At block 808, the microcode again reads the V-byte 502 and compares it with the new value to determine whether the new value was successfully written and, if not, retries a PF 202 blow operation as necessary up to the configurable number of retry attempts. Flow ends at block 808.

Figures 9, 10A, 10B:
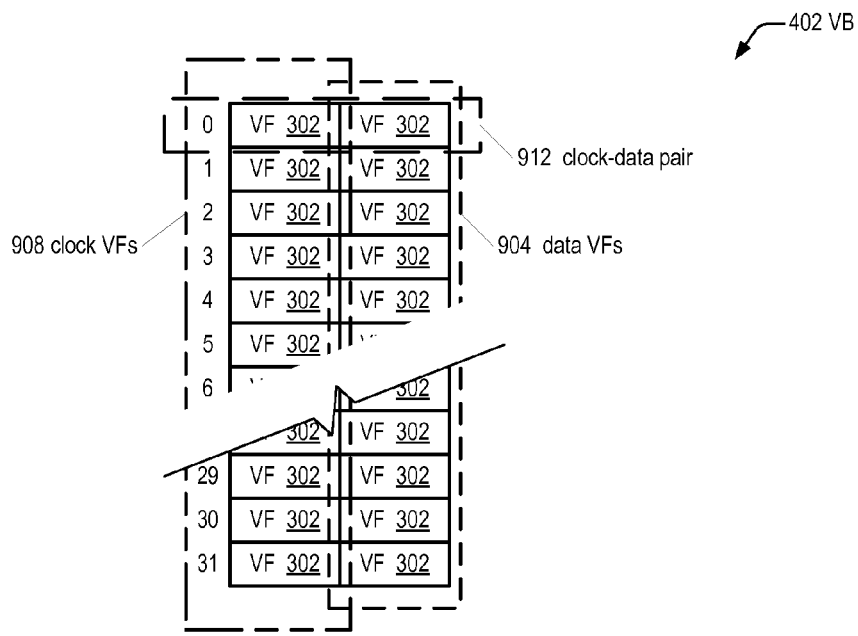
FIG. 9 is a block diagram illustrating an alternate embodiment of a fixed allocation scheme for allocating VFs to a FERNS VB.
FIG. 10a is timing diagram illustrating operation according to a first embodiment of the fixed allocation scheme of FIG. 9.
FIG. 10b is a timing diagram illustrating operation according to a second embodiment of the fixed allocation scheme of FIG. 9.

Referring now to FIG. 9, a block diagram illustrating an alternate embodiment of a fixed allocation scheme for allocating VFs 302 to a FERNS VB 402 is shown. The VFs 302 are grouped in two groups: a first group are data VFs 904, and a second group are clock VFs 908, with the number of data VFs 904 and the number of clock VFs 908 being equal. A data VF 904 and a clock VF 908 at the same position constitute a clock-data pair 912. In the embodiment of FIG. 9, 32 clock-data pairs 912, numbered 0 through 31, make up the VB 402. The current value of a VB 402 according to the clock-data embodiment of FIG. 9 is reflected by the value of the data VF 904 in the clock-data pair 912 whose clock VF 908 is the last sequentially unblown clock VF 908 according to the alternate embodiment of FIG. 10a (or blown clock VF 908 according to the alternate embodiment of FIG. 10b) of the clock-data pairs 912 that make up the VB 402. An advantage of the embodiment of FIG. 9 is that because the single VF 302 directly reflects the value of the VB 402, the microprocessor 100 need not perform a Boolean XOR operation on a plurality of VFs 302 in order to generate the VB 402 value, which is required in the embodiment of FIG. 6; however, the microprocessor 100 needs to determine the last sequentially unblown clock VF 908 (or blown clock VF 908 according to the alternate embodiment of FIG. 10b). According to some embodiments, the VB 402 may be the object of a number of toggling writes equal to the number of VFs 302 making up the VB 402, as discussed below. Thus, in the example of FIG. 9, the VB 402 may be the object of 64 toggling writes; and in the examples of FIGS. 10a and 10b, the VB 402 may be the object of six toggling writes. According to other embodiments, the VB 402 may be the object of a number of toggling writes equal to one less than the number of VFs 302 making up the VB 402, as discussed below. Thus, in the example of FIG. 9, the VB 402 may be the object of 63 toggling writes; and in the examples of FIGS. 10a and 10b, the VB 402 may be the object of five toggling writes.

Referring now to FIG. 10a, a timing diagram illustrating operation according to a first embodiment of the fixed allocation scheme of FIG. 9 is shown. The timing diagram includes six times denoted 0 through 5. The times 0 through 5 simply indicates points in time and are not intended to indicate that a fixed period occurs between each time shown. Rather, each different time shown indicates a change in the VB 402 made in response to a toggling write. For each time slot the state (blown—"B" or unblown—"U") of the each clock VF 908 and data VF 904 is shown, as well as the binary VB 402 value. In this embodiment, the microprocessor 100 blows clock-data pair 912 VFs 302 beginning at position 0 sequentially to position 31. However, for clarity and simplicity of illustration, only the three clock VFs 908 and three data VFs 904 corresponding to clock-data pair 912 positions 0-2 of FIG. 9 are shown in FIG. 10a, and the state of all the other VFs 302 (i.e., in positions 3 through 31) is assumed to be unblown.

As initially fabricated, i.e., at time=0, all VFs 302 are unblown. In the embodiment of FIG. 10a, the current value of the VB 402 is reflected by the value of the data VF 904 in the clock-data pair 912 whose clock VF 908 is the last sequentially unblown clock VF 908. (This is in contrast to the embodiment of FIG. 10b in which the current value of the VB 402 is reflected by the value of the data VF 904 in the clock-data pair 912 whose clock VF 908 is the last sequentially blown clock VF 908.) That is, the microprocessor 100 scans the clock VFs 908 beginning at position 0 until it finds an unblown clock VF 908, and then takes the value of the data VF 904 in that clock-data pair 912 as the value of the VB 402. In the example of FIG. 10a, since at time=0 the last sequential clock VF 908 that is unblown is at position 0, the data VF 904 at position 0 denotes the current state of the VB 402. Therefore, in the example shown the VB 402 reflects a value of 0 because the data VF 904 at the selected position is unblown.

Subsequently an instruction requests that the state of the VB 402 be written to a 1. In response, the fuse blowing device 116 blows the data VF 904 at position 0, which changes the VB 402 value to 1, as shown at time=1. Subsequently an instruction requests that the state of the VB 402 be written to a 0. In response, the fuse blowing device 116 blows the clock VF 908 at position 0, which changes the VB 402 value to 0, as shown at time=2. Recall that the VB 402 is the data VF 904 value of the clock-data pair 912 that is the last sequential clock VF 908 that is unblown, starting from position 0. Since the clock VF 908 at position 0 is blown and the clock VF 908 at position 1 is unblown, the VB 402 value is the data VF 904 value at position 1. Since the data VF 904 at position 1 is unblown, the VB 402 will now be read as a 0 by the program.

Subsequently an instruction requests that the state of the VB 402 be written to a 1. In response, the fuse blowing device 116 blows the data VF 904 at position 1, which changes the VB 402 value to 1, as shown at time=3. Fuse blowing continues in this fashion, such as shown with respect to times 4 and 5, until no more clock-data pairs 912 are available to change the requested state of the VB 402, at which time an exception or other condition is indicated to the processor.

Referring now to FIG. 10b, a timing diagram illustrating operation according to a second embodiment of the fixed allocation scheme of FIG. 9 is shown. The timing diagram shown in FIG. 10b is similar to the timing diagram shown in FIG. 10a. However, in the embodiment of FIG. 10b, the current value of the VB 402 is reflected by the value of the data VF 904 in the clock-data pair 912 whose clock VF 908 is the last sequentially blown clock VF 908. That is, the microprocessor 100 scans the clock VFs 908 beginning at position 0 until it finds a blown clock VF 908, and then takes the value of the data VF 904 in that clock-data pair 912 as the value of the VB 402. In the example of FIG. 10b, since at time=0 the last sequential clock VF 908 that is blown is at position 0, the data VF 904 at position 0 denotes the current state of the VB 402. Therefore, in the example shown the VB 402 reflects a value of 0 because the data VF 904 at the selected position is unblown.

Since all VFs 302 are initially unblown, in order for the embodiment of FIG. 10b to operate properly, it is necessary for the clock VF 908 at position 0 to be blown prior to the first time a program attempts to write the VB 402. According to one embodiment, the clock VF at position 0 is blown at fabrication time. Alternatively, the microprocessor 100 microcode detects the initial condition and blows the clock VF 908 in position 0 as part of its very first power-up sequence following fabrication. Thus, at time=0 in FIG. 10b, the clock VF 908 at position 0 is blown, and all other VFs 302 are unblown. Since at time=0 the last sequential clock VF 908 that is blown is at position 0, the data VF 904 at position 0 denotes the current state of the VB 402. Therefore, in the example shown the VB 402 reflects a value of 0 because the data VF 904 at the selected position is unblown.

Subsequently an instruction requests that the state of the VB 402 be written to a 1. In response, the fuse blowing device 116 blows the data VF 904 at position 0, which changes the VB 402 value to 1, as shown at time=1. Subsequently an instruction requests that the state of the VB 402 be written to a 0. In response, the fuse blowing device 116 blows the clock VF 908 at position 1, which changes the VB 402 value to 0, as shown at time=2. Recall that the VB 402 is the data VF 904 value of the clock-data pair 912 that is the last sequential clock VF 908 that is blown, starting from position 0. Since the clock VF 908 at position 0 is blown and the clock VF 908 at position 1 is blown, the VB 402 value is the data VF 904 value at position 1. Since the data VF 904 at position 1 is unblown, the VB 402 will now be read as a 0 by the program.

Subsequently an instruction requests that the state of the VB 402 be written to a 1. In response, the fuse blowing device 116 blows the data VF 904 at position 1, which changes the VB 402 value to 1, as shown at time=3. Fuse blowing continues in this fashion, such as shown with respect to times 4 and 5, until no more clock-data pairs 912 are available to change the requested state of the VB 402, at which time an exception or other condition is indicated to the processor.

Figure 11:
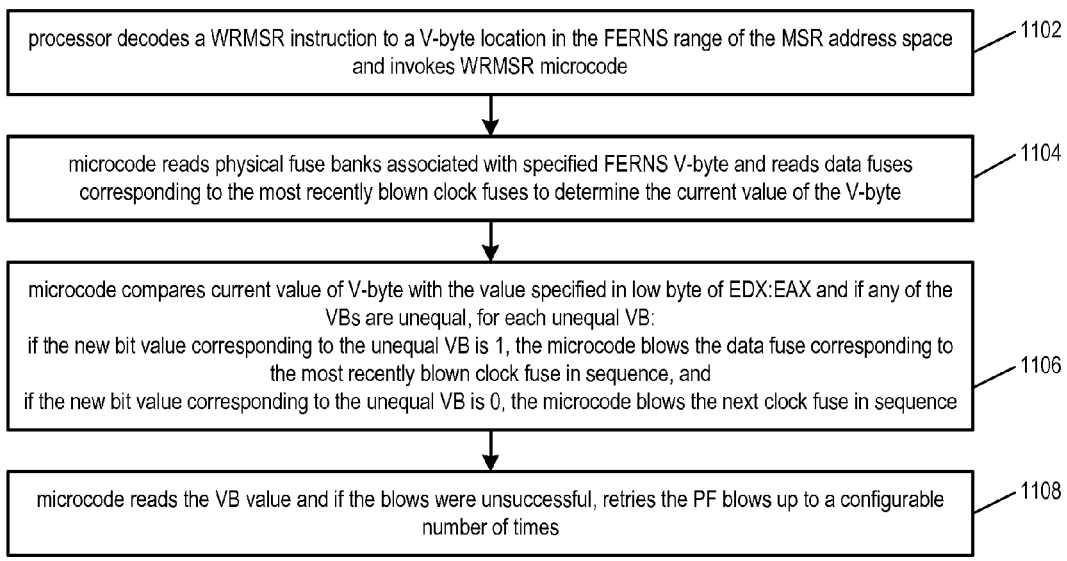
FIG. 11 is a flowchart illustrating operation of the microprocessor to execute a WRMSR instruction to a location in the FERNS range of the MSR address space employing the embodiment of FIGS. 9 and 10b.

Referring now to FIG. 11, a flowchart illustrating operation of the microprocessor 100 to execute a WRMSR instruction to a location in the FERNS range of the MSR address space employing the embodiment of FIGS. 9 and 10b is shown. That is, the current value of a VB 402 is reflected by the value of the data VF 904 in the clock-data pair 912 whose clock VF 908 is the last sequentially blown clock VF 908. The description in FIG. 11 assumes the program is presented with a V-byte 502 data type, i.e., each WRMSR instruction accessing a location in the FERNS range accesses a single byte of data. The Flow begins at block 1102.

At block 1102, the microprocessor 100 fetches from the instruction cache 102 a WRMSR program instruction, and the instruction decoder 104 decodes the WRMSR instruction and invokes the WRMSR microcode routine. Flow proceeds to block 1104.

At block 1104, the WRMSR microcode routine determines that the MSR address (specified in the ECX register) specifies a location in the FERNS range of the MSR address space, and writes the control registers appropriately to read the one or more physical fuse banks 204 that contain the PFs 202 associated with the FERNS V-byte 502 specified by the MSR address. The microcode then performs the necessary Boolean OR operations to generate the VF 302 values associated with the V-byte 502 specified by the MSR address. The microcode then, for each VB 402 making up the V-byte 502, sequentially scans the clock VFs 908 of the clock-data pairs 912 beginning with position 0 until it finds the first blown clock VF 908. The microcode then takes the value of the data VF 904 associated with the first sequentially blown clock VF 908 as the value of the VB 402. The microcode does this for each VB 402 of the V-byte 502. Flow proceeds to block 1106.

At block 1106, the microcode compares the current V-byte 502 value generated at block 1104 with the value to be written as specified by the WRMSR instruction, i.e., the value contained in the low byte of the EDX:EAX registers. If any of the bits are unequal, for each unequal bit the microcode writes the control registers appropriately to: (1) blow the data VF 904 corresponding to the most recently blown clock VF 908 in sequence, if the new bit value corresponding to the unequal VB 402 is 1; or (2) blow the next clock VF 908 in sequence if the new bit value corresponding to the unequal VB 402 is 0. Note that the microprocessor 100 does not blow any VFs 302 if the new bit value matches the current VB 402 value. Flow proceeds to block 1108.

At block 1108, the microcode again reads the V-byte 502 and compares it with the new value to determine whether the new value was successfully written and, if not, retries the operation up to the configurable number of retry attempts. Flow ends at block 1108.

As may be observed from FIG. 10a, the clock VF 908 at index 2 is never blown. That is, according to the clock-data pair 912 embodiment of FIG. 10a, the highest index clock VF 908 is always unblown. Thus, according to one embodiment, there need be no PFs 202 associated with the highest index clock VF 908 such that the bits of the physical fuse bank 204 that would normally have PFs 202 that make up the VF 302 associated with the highest index clock VF 908 are hardwired to the voltage value that represents the unblown state (e.g., GND) rather than having a PF 202 for the bits since if the PFs 202 were present they would never be blown. In this manner, the VB 402 may be the object of a number of toggling writes equal to the number of VFs 302 making up the VB 402. For example, in the example of FIG. 9, there are 63 VFs 302 (64 VFs 302 are shown, but the highest index clock VF 908 is hardwired) and the VB 402 may be the object of 63 toggling writes. For another example, according to this embodiment, the clock VF 908 at index 2 of FIG. 10a is hardwired, and the VB 402 having five VFs 302 may be the object of the five toggling writes shown. Similarly, as may be observed from FIG. 10b, the clock VF 908 at index 0 is always blown. Thus, according to one embodiment, the bits of the physical fuse bank 204 associated with the lowest index clock VF 908 are hardwired to the voltage value that represents the blown state (e.g., Vcc) rather than having a PF 202 for the bits since if the PFs 202 were present they would always be blown.

In an alternate embodiment associated with the embodiment of FIG. 10a, the bits of the physical fuse bank 204 associated with the highest index clock VF 908 include PFs 202 and the microprocessor 100 (e.g., the microcode) treats as a special case the situation in which all the clock VFs 908 of a VB 402 are blown. For example, FIG. 10a illustrates five toggling writes to a VB 402 having six VFs 302. However, according to the alternate embodiment, the microcode performs a sixth toggling write by blowing the clock VF 908 at index 2, and the microcode 106 interprets a VB 402 in which all the clock VFs 908 are blown as having a Boolean zero. Thus, in this alternate embodiment, the VB 402 may be the object of a number of toggling writes equal to the number of VFs 302 making up the VB 402, which in the example of FIG. 10a is six. Analogously, in an alternate embodiment with respect to the embodiment of FIG. 10b, the microcode treats as a special case the situation in which all the clock VFs 908 of a VB 402 are unblown. Thus, the initial condition of the VB 402 is not as shown at time 0 in FIG. 10b; rather, the initial condition of the VB 402 is one in which all of the clock VFs 908 are unblown, which the microcode interprets as having a Boolean one value. When the microprocessor 100 receives the first toggling write request, the microprocessor 100 blows the clock VF 908 at index 0, as shown at time 0 in FIG. 10b, and so forth. Thus, in this alternate embodiment, the VB 402 may be the object of a number of toggling writes equal to the number of VFs 302 making up the VB 402, which in the example of FIG. 10b is six.

In other embodiments in which some of the VFs 302 are not hardwired and in which the microcode treats as special cases as described above, the VB 402 may be the object of a number of toggling writes equal to one less than the number of VFs 302 making up the VB 402.

A possible disadvantage of a fixed allocation scheme, such as described above with respect to FIGS. 6 and 9, in which the FERNS subsystem presents a data type wider than a single VB 402—a V-byte 502, for example—is that statistically it is likely to waste PFs 202 because it is likely the number of toggling writes to some VBs 402 within the V-byte 502 will be different from the number of toggling writes to other VBs 402 within the V-byte 502. That is, statistically there will be a VB 402 within a V-byte 502 that will exhaust its PFs 202 before other VBs 402 within the same V-byte 502 exhaust their PFs 202. Thus, variable allocation schemes are also contemplated. A variable allocation scheme attempts to address the PF 202 waste problem, however with its own associated waste, namely, that some of the PFs 202 are used to implement the variable allocation scheme (e.g., as a pointer 1206 of the embodiment of FIG. 12) rather than as actual data bits (e.g., as data VFs 1204 of the embodiment of FIG. 12).

Figure 12:
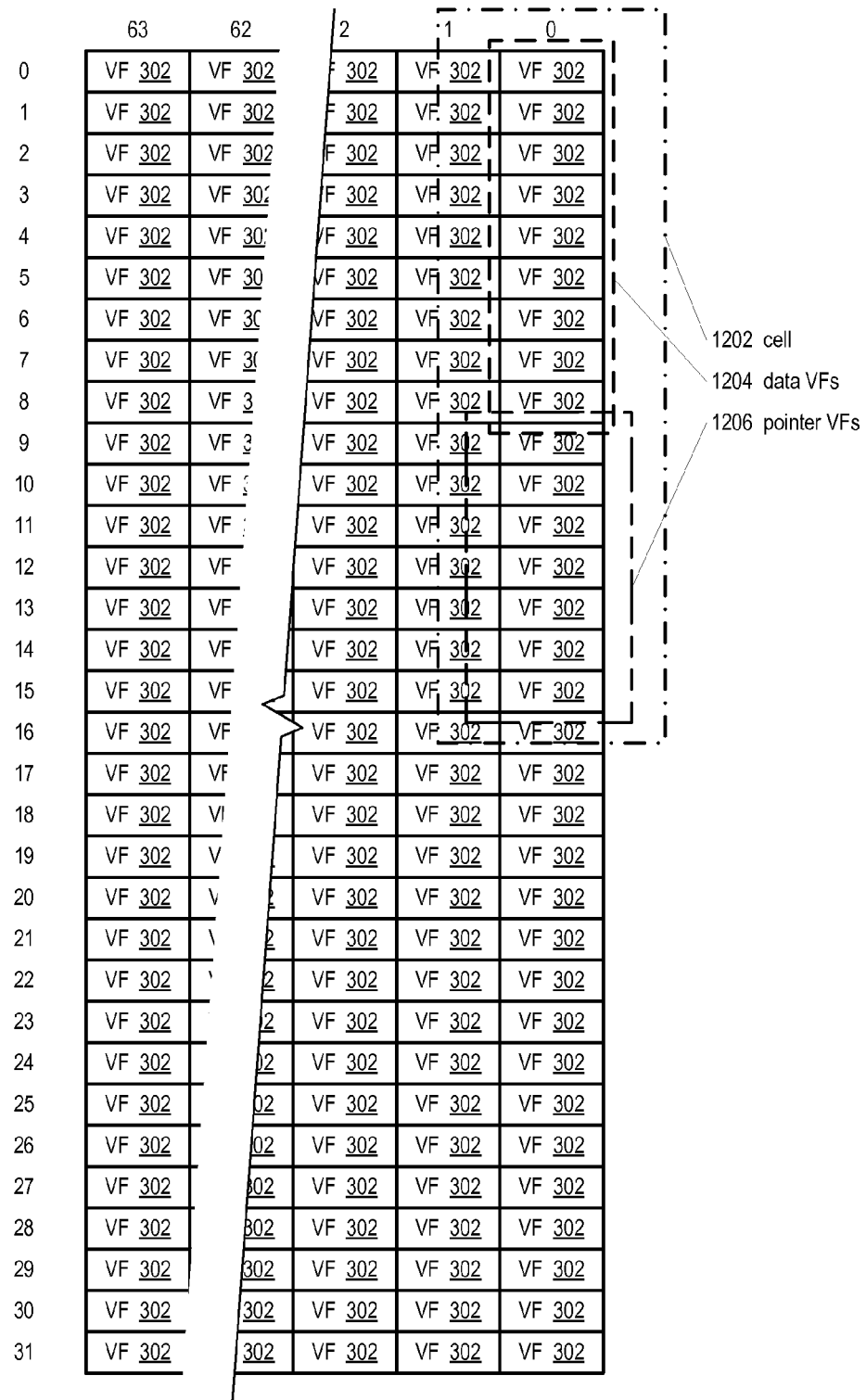
FIG. 12 is a block diagram illustrating one embodiment of a variable scheme of allocating VFs 302 to provide a FERNS subsystem.

Referring now to FIG. 12, a block diagram illustrating one embodiment of a variable scheme of allocating VFs 302 to provide a FERNS subsystem is shown. The VFs 302 are grouped as cells 1202. A cell 1202 includes M "data" VFs 1204 and N "pointer" VFs 1206. In the embodiment of FIG. 12, M is nine and N is seven. The data VFs 1204 store values that are used in a manner similar to the VFs 302 of FIGS. 4 and 6 (or alternately of FIG. 9) to generate a VB 402 value. The pointer VFs 1206 are used to point to another cell 1202. In this manner, a VB 402 can be generated from the data VFs 1204 of a linked list of cells 1202 which are linked by their pointer VFs 1206.

In the embodiment of FIG. 12, there are 2048 VFs 302 grouped as 128 cells 1202, denoted 0 through 127. Because each pointer 1206 value is 7 bits, it has the ability to point to each of the 128 different cells 1202. Thus, for example, a pointer value 1206 of 53 points to cell 53. Initially, each VF 302 has a binary 0 value; thus, each pointer 1206 has an initial value of 0. If a pointer 1206 has a value of 0, the microcode treats the pointer 1206 as a null pointer indicating that cell 1202 is the last cell 1202 in the linked list of cells 1202. Thus, in the flowchart of FIG. 8, at steps 804, 806, and 808, the microcode must traverse the pointers 1206 of the cells 1202 as necessary to determine which data VFs 1204 to XOR to generate the VB 402 values (steps 804 and 808) and to determine the next available data VF 1204 to blow (step 806).

Each cell 1202 is classified as either a root cell 1304 or an expansion cell 1312, as shown in FIG. 13. A root cell 1304 is a cell 1202 that is at the head of a linked list of one or more cells 1202 associated with a particular VB 402. Thus, a root cell 1304 is never pointed to by another cell 1202. Each VB 402 has a single associated root cell 1304. The root cells 1304 are associated with the VBs 402 in a fixed one-to-one manner. Thus, root cells 1304 are statically pre-allocated and are not available for dynamic allocation during program operation. In one embodiment, the root cells 1304 are statically pre-allocated and associated with the VBs 402 in the fixed manner by the microcode. In contrast, expansion cells 1312 are not, at least initially, associated with a particular VB 402. Instead, expansion cells 1312 are in a free pool of available cells 1202 that may be dynamically allocated for a VB 402 and incorporated into the linked list of the VB 402 as needed to perform program writes to FERNS. The number of root cells 1304 is equal to the number of VBs 402 of the FERNS subsystem, and the remaining cells 1202 are included in the free pool of available cells 1202. In one embodiment, if the number of VBs 402 is N, then the microcode statically allocates the cells 1202 in positions 0 through N−1 as root cells 1304 associated with the N VBs 402.

According to the embodiment of FIG. 12, when the microcode needs to blow a data VF 1204 to toggle the value of a VB 402, but no more data VFs 1204 are available in the current cell 1202 (i.e., the cell 1202 at the end of the linked list), the microcode searches for the next available expansion cell 1312 by examining the expansion cells 1312 (sequentially according to one embodiment) until an expansion cell 1312 is found that has only unblown data VFs 1204. The microcode then blows the pointer 1206 of the current cell 1202 (i.e., the cell for which no more data VFs 1204 are available) to a value that points to the next available expansion cell 1312 that was just found to add the expansion cell 1312 to the linked list. The microcode then blows a data VF 1204 in the newly linked expansion cell 1312 to toggle the VB 402 value.

The microcode must search for an available expansion cell 1312 each time one is needed because there is no non-volatile storage available to indicate the next free expansion cell 1312. However, in an alternate embodiment, when the microprocessor 100 boots up, the microcode scans all expansion cells 1312 and populates a volatile memory location within the microprocessor 100 to indicate the next available expansion cell 1312. In this fashion, the scan to find the next free expansion cell 1312 only need be performed once per reset of the microprocessor 100, instead of every time a new expansion cell 1312 is needed, resulting in improved performance.

Figure 13A:
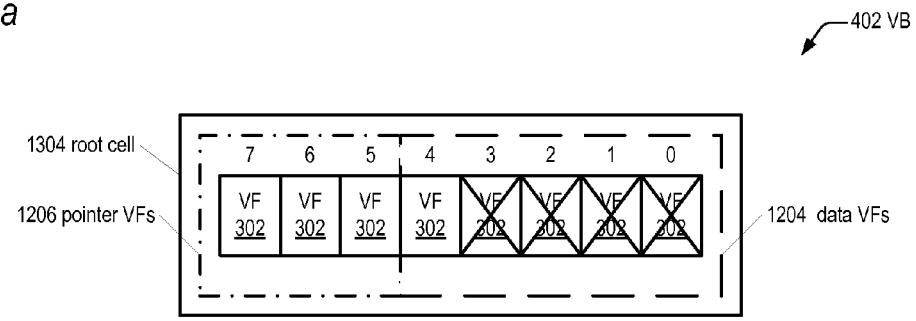
FIGS. 13a and 13b are block diagrams illustrating operation of the microprocessor employing the variable VF 302 allocation scheme of FIG. 12.
Figure 13B:
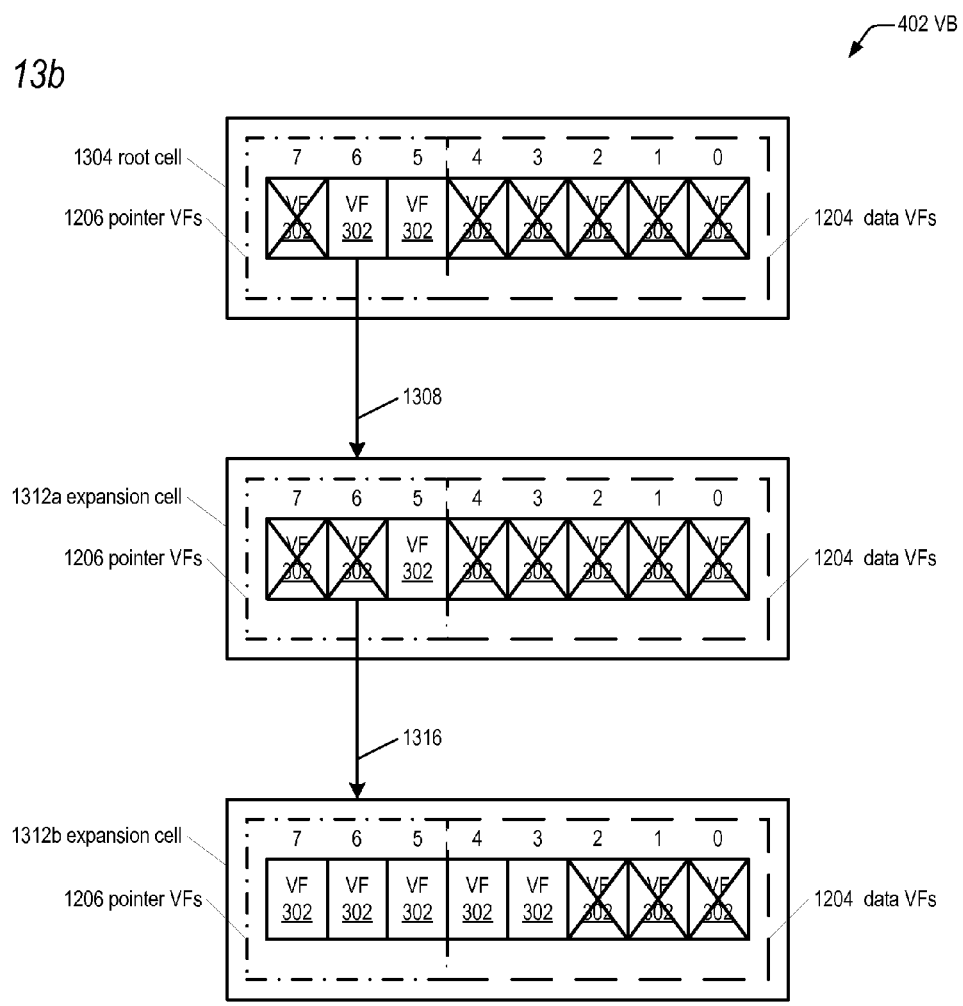

Referring now to FIG. 13a, a first block diagram illustrating operation of the microprocessor 100 employing the variable VF 302 allocation scheme of FIG. 12 is shown. In FIGS. 13a and 13b, a blown VF 302 is indicated by being covered with an "X". FIG. 13a illustrates the state of a VB 402 comprising only a root cell 1304, i.e., a linked list comprising a single root cell 1304. FIG. 13a illustrates the state of the VB 402 after the microprocessor 100 has performed 4 toggling writes to the VB 402. For illustration purposes, the number of data VFs 1204 and pointer VFs 1206 in the example of FIG. 13 is less than in FIG. 12. Specifically, the root cell 1304 comprises eight VFs 302. The VFs 302 at positions 0-4 are data VFs 1204, and the VFs 302 at positions 5-7 are pointer VFs 1206 of FIG. 12. Thus, the possible number expansion cells 1312 in the FERNS subsystem that may be pointed to by the pointer 1206 is eight. In the example, the microprocessor 100 has blown the data VFs 1204 in positions 0 through 3 in response to four prior toggling writes. The data VF 1204 in position 4 is unblown. Additionally, the pointer VFs 1206 are unblown, indicating that the root cell 1304 is at the end of the linked list and is the only cell 1202 in the linked list, because the data VFs 1204 of the root cell 1304 have not yet been exhausted.

Referring now to FIG. 13b, a second block diagram illustrating operation of the microprocessor 100 employing the variable VF 302 allocation scheme of FIG. 12 is shown. FIG. 13b illustrates the state of a VB 402 comprising the root cell 1304 of FIG. 13a and two expansion cells 1312, denoted 1312a and 1312b, which are linked to the root cell 1304 to form a linked list. FIG. 13b illustrates the state of the VB 402 after the microprocessor 100 has performed 13 toggling writes to the VB 402. Specifically, all five data VFs 1204 of the root cell 1304 and the first expansion cell 1312a have been blown, and the first three data VFs 1204 of the second expansion cell 1312b have been blown as follows.

In response to a fifth toggling write to the VB 402, the microprocessor 100 blew the data VF 1204 in position 4 of the root cell 1304. In response to a sixth toggling write to the VB 402, the microprocessor 100 searched for the next available expansion cell 1312 and found the expansion cell 1312a at position 4. Consequently, the microprocessor 100 blew the pointer VFs 1206 of the root cell 1304 to a value of 4 to point to the expansion cell 1312a at position 4. The microprocessor 100 then blew the data VF 1204 at position 0 in the expansion cell 1312a. In response to a seventh, eighth, ninth, and tenth toggling write to the VB 402, the microprocessor 100 blew the data VFs 1204 in positions 1 through 4 of the expansion cell 1312a, respectively. In response to an eleventh toggling write to the VB 402, the microprocessor 100 searched for the next available expansion cell 1312 and found the expansion cell 1312b at position 6. Consequently, the microprocessor 100 blew the pointer VFs 1206 of the first expansion cell 1312a to a value of 6 to point to the second expansion cell 1312b at position 6. The microprocessor 100 then blew the data VF 1204 at position 0 in the second expansion cell 1312b. In response to a twelfth, thirteenth, and fourteenth toggling write to the VB 402, the microprocessor 100 blew the data VFs 1204 in positions 1 through 3 of the second expansion cell 1312b, respectively. The pointer 1206 of the second expansion cell 1312b remains zero, indicating the second expansion cell 1312b is at the end of the linked list associated with the VB 402.

Although the variable allocation scheme of FIG. 12 has been described as employing the XOR'ing VF 302 embodiment of generating a VB 402 value associated with FIG. 6, the variable allocation scheme may also be employed with the clock-data pair 912 embodiment of generating a VB 402 value associated with FIG. 9. In the latter case, each cell 1202 includes an even number of data VFs 1204 so that the number of clock VFs 908 and data VFs 904 are equal; that is, half of the data VFs 1204 are clock VFs 908 and half are data VFs 904.

As may be observed by comparing the embodiments of FIG. 6 and FIG. 12, given the same number of PFs 202, and assuming the microprocessor 100 is configured to allocate two PFs 202 per VF 302 with a total of 4096 PFs 202, the maximum total number of toggling VB 402 writes the program can perform is 2048 for the fixed allocation embodiment of FIG. 6 and is 1152 for the variable allocation embodiment of FIG. 12 (128 cells each with nine data VFs 302). However, it may be that in embodiments that present a user interface such that each MSR in FERNS space appears as a data type wider than a single bit (such as a V-byte, V-word, V-dword, or V-qword data type), the number of toggling writes to the wide data types that the FERNS subsystem presents is greater for the variable allocation scheme than for the fixed allocation scheme.

According to one embodiment, given as an example, the program is presented with four V-bytes 502 that appear at four different MSR addresses. Thus, 32 of the cells 1202 (cells 0 through 31) are initially statically allocated in a fixed manner as the root cell 1202 of the respective 32 VBs 402 that make up the four V-bytes 502. In one embodiment, the microcode 106 associates four groups of eight root cells 902 with the four MSRs in the FERNS MSR address range. The remaining 96 cells 1202 (cells 32 through 127) are initially unallocated and constitute a pool of available cells 1202 that are available for the microcode 106 to dynamically allocate and associate with VBs 402 of the four MSRs in the FERNS MSR address range as needed according to the characteristics of the binary values written to the FERNS by the program. The variable allocation scheme potentially uses the VFs 302 more efficiently than a fixed allocation scheme by allowing VBs 402 that are the target of a relatively greater number of toggling writes to have more VFs 302 allocated to them, whereas VBs 402 that are the target of a relatively smaller number of toggling writes have fewer VFs 302 allocated to them.

In both the fixed and variable allocation schemes, the microprocessor 100 manufacturer may specify a guaranteed minimum number of times that each FERNS location may be written. In the embodiment of FIG. 6, each VB 402 may be written at least 32 times, and in the embodiment of FIG. 12, each VB 402 may be written at least nine times. However, as discussed above, it is possible that each FERNS location may be successfully written more times than the specified minimum, depending upon the nature of the values written. However, writing to the FERNS beyond the specified minimum number of times requires the program to be prepared to handle an exception or other error indication generated by the microprocessor 100 (as described above) to indicate that the write failed.

Figure 14:
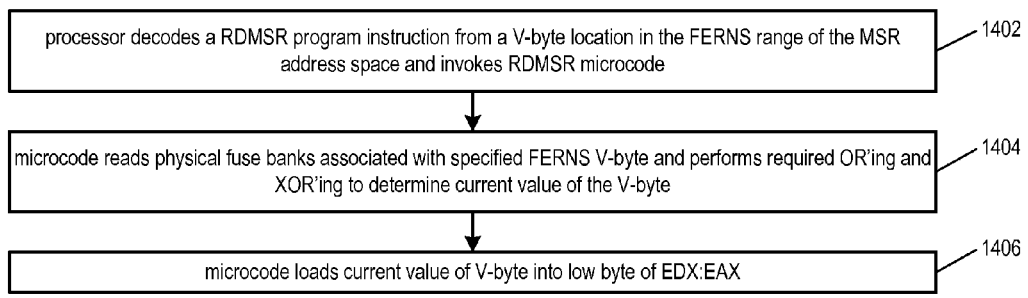
FIG. 14 is a flowchart illustrating operation of the microprocessor to execute a RDMSR instruction from a location in the FERNS range of the MSR address space.

Referring now to FIG. 14, a flowchart illustrating operation of the microprocessor 100 to execute a RDMSR instruction from a location in the FERNS range of the MSR address space is shown. The description in FIG. 14 assumes the program is presented with a V-byte 502 data type, i.e., each RDMSR instruction accessing a location in the FERNS range accesses a single byte of data. Flow begins at block 1402.

At block 1402, the microprocessor 100 fetches from the instruction cache 102 a RDMSR program instruction, and the instruction decoder 104 decodes the RDMSR instruction and invokes the RDMSR microcode routine. Flow proceeds to block 1404.

At block 1404, the RDMSR microcode routine determines that the MSR address (specified in the ECX register) specifies a location in the FERNS range of the MSR address space, and writes the control registers appropriately to read the one or more physical fuse banks 204 that contain the PFs 202 associated with the FERNS V-byte 502 specified by the MSR address. The microcode then performs the necessary Boolean OR operations to generate the VF 302 values associated with the V-byte 502 specified by the MSR address. The microcode then performs the necessary Boolean XOR operations to generate the values of the VBs 402 of the V-byte 502. Alternatively, in the case of the clock-data pair 912 embodiment of FIG. 9, the microcode instead generates the values of the VB 402 of the V-byte 502 as the data VF 904 value corresponding to the most recently blown (or unblown) clock VF 908, as described above with respect to FIGS. 9, 10*a* and 10*b*. Flow proceeds to block 1406.

At block 1406, the microcode loads the V-byte 502 value generated at block 1404 into the low byte of the EDX:EAX registers. Flow ends at block 1406.

As mentioned above, there are some situations in which the traditional non-volatile memory resources of the system (such as tape, disk, CMOS, battery-backed, or FLASH memory) are not available for some applications and which the microprocessor may not itself (i.e., apart from program instructions external to the microprocessor that are fetched and executed by the microprocessor, namely the BIOS, the operating system, and application programs and utilities) access through the operating system. For example, in certain situations it may be desirable for the microprocessor to perform some action before it executes any BIOS or operating system instructions. Some of the contemplated applications for the FERNS are as follows: 1) storage of information related to software installation; 2) storage of the number of microprocessor faults observed (such as a machine check or ECC error fault or temperature threshold exceeded), which may be checked by the microprocessor when coming out of each reset such that the microprocessor decides not to boot up if the number exceeds a threshold; 3) storage that indicates the security of the microprocessor has been breached and the microprocessor must be shut down, which may be checked by the microprocessor when coming out of each reset such that the microprocessor decides not to boot up if the microprocessor has become insecure; 4) storage for indicating that a subscriber's subscription (either hardware or software running thereon or both) has expired, such that the microprocessor when coming out of each reset decides to boot up with degraded functionality until the subscriber pays the subscription fee (e.g., the microprocessor displays a message on the screen informing the user the subscription needs to be paid); 5) storage of information used to verify that software running on the microprocessor has not been contaminated; 6) storage of information used to determine whether the system configuration has been changed, particularly whether the system configuration has been changed sufficiently to warrant denying access to specific software applications.

Although embodiments have been described in which the FERNS is written and read under program control, such as system software, other embodiments are contemplated in which a portion of the FERNS is reserved for the microprocessor itself to write and read internally independent of program control. In these embodiments, the microcode writes or reads the FERNS in response to other events, rather than in response to a program instruction. For example, the microprocessor may itself detect a memory check condition (e.g., ECC error) or a condition that it has exceeded a predetermined temperature threshold and needs to shut down. Before shutting down, the microcode will increment (read, modify, write) a value in the FERNS to record the number of times this condition has occurred. Furthermore, if the number of times has exceeded another predetermined threshold, the microcode will take further action, such as blowing a disable fuse, to disable the microprocessor from booting any more in order to prevent possible data corruption or physical damage.

Although embodiments have been described in which the x86 WRMSR and RDMSR instructions are used to address the FERNS, other embodiments are contemplated in which other instructions are used, such as new instructions added to the instruction set architecture of the microprocessor.

Although an embodiment has been described in which the microprocessor generates an exception to a WRMSR instruction that specifies an address in the FERNS address range if the microprocessor is unsuccessful in performing the instruction (such as, if no fuses within the fuse banks were available to write the new value), other means are contemplated for indicating to the program that the write failed, such as returning a status value in a general purpose register or alternative MSR, or setting a predetermined one of the flags in the x86 EFLAGS register. Embodiments are also contemplated in which some of the functions performed by microcode as described herein are performed instead by hardware logic.

While various embodiments of the present invention have been described herein, it should be understood that they have been presented by way of example, and not limitation. It will be apparent to persons skilled in the relevant computer arts that various changes in form and detail can be made therein without departing from the scope of the invention. For example, in addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code, and instructions disposed in any form, such as source, object or machine language) disposed, for example, in a computer usable (e.g., readable) medium configured to store the software. Such software can enable, for example, the function, fabrication, modeling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). Embodiments of the present invention may include methods of providing a microprocessor described herein by providing software describing the design of the microprocessor and subsequently transmitting the software as a computer data signal over a communication network including the Internet and intranets. It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present invention should not be limited by any of the herein-described exemplary embodiments, but should be defined only in accordance with the following claims and their equivalents. The present invention is implemented within a microprocessor device which may be used in a general purpose computer.

Finally, those skilled in the art should appreciate that they can readily use the disclosed conception and specific embodiments as a basis for designing or modifying other structures for carrying out the same purposes of the present invention without departing from the scope of the invention as defined by the appended claims.

We claim:

1. A microprocessor including re-writeable non-volatile state (RNS) that is addressable by an instruction executed by the microprocessor that instructs the microprocessor to write a new value to the RNS, the microprocessor comprising:
    a plurality of fuses, each readable by the microprocessor to determine whether the fuse is blown or unblown, in response to the microprocessor decoding the instruction, wherein each of the plurality of fuses provides a first Boolean value when read if blown and a second Boolean value when read if unblown, wherein the plurality of fuses are initially unblown;
    a Boolean logic unit, coupled to the plurality of fuses, configured to perform Boolean operations on the values read from the plurality of fuses in order to determine a current value of the RNS; and
    a fuse blowing device, coupled to the plurality of fuses, configured to blow at least one unblown fuse of the plurality of fuses to change the current value of the RNS to the new value specified by the instruction when the new value is different than the current value of the RNS;
    wherein the microprocessor is configured to read the plurality of fuses, perform the Boolean operations, and blow at least one unblown fuse to change the current value of the RNS to a new value multiple times in response to a program running on the microprocessor executing the instruction multiple times.

2. The microprocessor as recited in claim 1, further configured to indicate to the program comprising the instruction a condition in which the number of unblown fuses of the plurality of fuses is insufficient to change the current value of the RNS to the new value by blowing at least one of the unblown fuses of the plurality of fuses.

3. The microprocessor as recited in claim 2, wherein the microprocessor is configured to indicate the condition by raising an exception to the instruction.

4. The microprocessor as recited in claim 2, wherein the microprocessor is configured to indicate the condition by returning a predetermined value to the instruction.

5. The microprocessor as recited in claim 1, further comprising:
    an instruction decoder, configured to decode the instruction; and
    microcode, invokeable in response to the instruction decoder decoding the instruction, configured to:
        read the values from the plurality of fuses;
        instruct the Boolean logic unit to perform Boolean operations on the values read from the plurality of fuses;
        determine the current value of the RNS; and
        instruct the fuse blowing device to blow the at least one unblown fuse of the plurality of fuses to change the current value of the RNS to the new value specified by the instruction.

6. The microprocessor as recited in claim 1, wherein each of the plurality of fuses is a virtual fuse comprising a plurality of physical fuses.

7. The microprocessor as recited in claim 6, wherein the value of the virtual fuse is the Boolean OR of the value read from each of the plurality of physical fuses comprising the virtual fuse.

8. The microprocessor as recited in claim 6, wherein the virtual fuse is blown if at least one of the plurality of physical fuses comprising the virtual fuse is blown.

9. The microprocessor as recited in claim 6, wherein the virtual fuse is unblown if none of the plurality of physical fuses comprising the virtual fuse is blown.

10. The microprocessor as recited in claim 1, wherein the Boolean logic unit performs a Boolean exclusive-OR (XOR) operation on the values read from the plurality of fuses to determine the current value of the RNS.

11. The microprocessor as recited in claim 10, wherein each of the plurality of fuses is a virtual fuse comprising a plurality of physical fuses, wherein the value of the virtual fuse is the Boolean OR of the value read from each of the plurality of physical fuses comprising the virtual fuse.

12. The microprocessor as recited in claim 1, wherein the RNS is addressable by the instruction as a data type comprising a plurality of bits, wherein the new value specified by the instruction comprises a plurality of bits.

13. The microprocessor as recited in claim 1, wherein the new value specified by the instruction executed by the microprocessor that instructs the microprocessor to write to the new value to the RNS comprises a single bit.

14. The microprocessor as recited in claim 1, wherein the instruction executed by the microprocessor that instructs the microprocessor to write to the new value to the RNS comprises an x86 WRMSR instruction.

15. The microprocessor as recited in claim 1, wherein the RNS is addressable by the instruction executed by the microprocessor that instructs the microprocessor to write a new value to the RNS via an x86 model specific register (MSR) address specified by the instruction.

16. The microprocessor as recited in claim 1, wherein the RNS is addressable within an x86 MSR address space of the microprocessor.

17. The microprocessor as recited in claim 6, wherein the fuse blowing device is a charge pump.

18. The microprocessor as recited in claim 1, wherein an amount of time to charge the fuse blowing device prior to blowing one of the plurality of fuses is configurable.

19. The microprocessor as recited in claim 1, wherein an amount of time to discharge the fuse blowing device to blow one of the plurality of fuses is configurable.

20. The microprocessor as recited in claim 1, wherein a number of times that the microprocessor retries blowing a fuse is configurable.

21. The microprocessor as recited in claim 1, wherein the plurality of fuses comprises a first plurality of data fuses and a second plurality of clock fuses corresponding to the plurality data fuses, wherein the microprocessor is configured to blow the data fuses in sequence and to blow the clock fuses in sequence.

22. The microprocessor as recited in claim 21, wherein the value of the data fuse corresponding to the most recently blown clock fuse in sequence is the current value of the RNS.

23. The microprocessor as recited in claim 21, wherein if the new value is the first Boolean value, then the fuse blowing device blows the data fuse corresponding to the most recently blown clock fuse in sequence, wherein if the new value is the second Boolean value, then the fuse blowing device blows the next clock fuse in sequence.

24. The microprocessor as recited in claim 1, wherein the plurality of fuses are grouped as a plurality of cells, wherein each of the plurality of cells includes data fuses and pointer fuses, wherein the fuse blowing device is configured to blow the pointer fuses to a value that points to an unallocated one of the plurality of cells to produce a linked list of two or more of the plurality of cells, wherein the Boolean logic unit performs the Boolean operations on the values read from the data fuses in the linked list of the two or more of the plurality of cells in order to determine the current value of the RNS.

25. The microprocessor as recited in claim 24, wherein the Boolean logic unit performs a Boolean exclusive-OR (XOR) operation on the values read from the data fuses in the linked list of the one or more of the plurality of cells in order to determine the current value of the RNS.

26. The microprocessor as recited in claim 24, wherein the fuse blowing device is configured to blow the pointer fuses to a value that points to an unallocated one of the plurality of cells to produce a linked list of two or more of the plurality of cells after all the data fuses of a first of the plurality of cells have been blown.

27. The microprocessor as recited in claim 1, wherein in response to a reset, if the microprocessor determines that the RNS has been written to a predetermined value, then the microprocessor refrains from fetching and executing external program instructions.

28. The microprocessor as recited in claim 1, wherein the Boolean logic unit is configured to perform Boolean operations on the values read from the plurality of fuses in order to determine a current value of the RNS and to load the current value of the RNS into an x86 architected register of the microprocessor, in response to the microprocessor decoding an x86 RDMSR instruction.

29. A method for a microprocessor to write a new value to a re-writeable non-volatile state (RNS) that is addressable by an instruction executed by the microprocessor, the method comprising:
    reading a plurality of fuses by the microprocessor to determine whether the fuse is blown or unblown, in response to the microprocessor decoding the instruction, wherein each of the plurality of fuses provides a first Boolean value when read if blown and a second Boolean value when read if unblown, wherein the plurality of fuses are initially unblown;
    performing Boolean operations by a Boolean logic unit on the values read from the plurality of fuses in order to determine a current value of the RNS;
    blowing at least one unblown fuse of the plurality of fuses by a fuse blowing device to change the current value of the RNS to the new value specified by the instruction when the new value is different than the current value of the RNS; and
    performing the step of reading, the step of performing Boolean operations, and the step of blowing at least one unblown fuse to change the current value of the RNS to a new value multiple times in response to a program running on the microprocessor executing the instruction multiple times.

30. The method as recited in claim 29, further indicating to the program comprising the instruction a condition in which the number of unblown fuses of the plurality of fuses is insufficient to change the current value of the RNS to the new value by blowing at least one of the unblown fuses of the plurality of fuses.

31. The method as recited in claim 29, further comprising:
    decoding an instruction, by an instruction decoder; and
    invoking microcode, in response to the instruction decoder decoding the instruction, configured to:
        read the values from the plurality of fuses;
        instruct the Boolean logic unit to perform Boolean operations on the values read from the plurality of fuses;
        determine the current value of the RNS; and
        instruct the fuse blowing device to blow the at least one unblown fuse of the plurality of fuses to change the current value of the RNS to the new value specified by the instruction.

32. The method as recited in claim 29, wherein the instruction executed by the microprocessor is an x86 WRMSR instruction.

33. The method as recited in claim 29, further comprising:
    addressing the RNS within an x86 MSR address space of the microprocessor.

34. A microprocessor including re-writeable non-volatile state (RNS), the microprocessor comprising:
    a plurality of fuses, each readable by the microprocessor to determine whether the fuse is blown or unblown, in response to detecting a predetermined condition, wherein each of the plurality of fuses provides a first Boolean value when read if blown and a second Boolean value when read if unblown, wherein the plurality of fuses are initially unblown;
    a Boolean logic unit, coupled to the plurality of fuses, configured to perform Boolean operations on the values read from the plurality of fuses in order to determine a current value of the RNS; and
    a fuse blowing device, coupled to the plurality of fuses, configured to blow at least one unblown fuse of the plurality of fuses to change the current value of the RNS to a new value when the new value is different than the current value of the RNS;
    wherein the microprocessor is configured to read the plurality of fuses, perform the Boolean operations, and blow at least one unblown fuse to change the current value of the RNS to a new value multiple times in response to detecting a predetermined condition when the new value is different than the current value of the RNS multiple times.

35. The microprocessor as recited in claim 34, further comprising:
   microcode, invokeable in response to detecting the predetermined condition, configured to:
      read the values from the plurality of fuses;
      instruct the Boolean logic unit to perform Boolean operations on the values read from the plurality of fuses;
      determine the current value of the RNS; and
      instruct the fuse blowing device to blow the at least one unblown fuse of the plurality of fuses to change the current value of the RNS to the new value.

36. A method for a microprocessor to write a new value to a re-writeable non-volatile state (RNS) that is addressable by the microprocessor, the method comprising:
   reading a plurality of fuses by the microprocessor to determine whether the fuse is blown or unblown, in response to detecting a predetermined condition, wherein each of the plurality of fuses provides a first Boolean value when read if blown and a second Boolean value when read if unblown, wherein the plurality of fuses are initially unblown;
   performing Boolean operations by a Boolean logic unit on the values read from the plurality of fuses in order to determine a current value of the RNS;
   blowing at least one unblown fuse of the plurality of fuses by a fuse blowing device to change the current value of the RNS to a new value when the new value is different than the current value of the RNS; and
   performing the step of reading, the step of performing Boolean operations, and the step of blowing at least one unblown fuse to change the current value of the RNS to a new value multiple times in response to detecting a predetermined condition multiple times.

37. The method as recited in claim 36, further comprising:
   invoking microcode, in response to detecting the predetermined condition, configured to:
      read the values from the plurality of fuses;
      instruct the Boolean logic unit to perform Boolean operations on the values read from the plurality of fuses;
      determine the current value of the RNS; and
      instruct the fuse blowing device to blow the at least one unblown fuse of the plurality of fuses to change the current value of the RNS to the new value.

38. A microprocessor including re-writeable non-volatile state (RNS) that is addressable by an instruction executed by the microprocessor that instructs the microprocessor to write a new value to the RNS, the microprocessor comprising:
   a plurality of virtual fuses, each comprising a plurality of physical fuses, wherein each physical fuse is readable by the microprocessor to determine whether the physical fuse is blown or unblown in response to the microprocessor decoding the instruction, wherein the microprocessor Boolean ORs the plurality of physical fuses to generate a first Boolean value of the virtual fuse when read if at least one of the plurality of physical fuses is blown and a second Boolean value when read if none of the plurality of physical fuses are blown, wherein the plurality of physical fuses are initially unblown;
   a plurality of virtual bits, each comprising a plurality of the plurality of virtual fuses, wherein the microprocessor Boolean XORs the plurality of virtual fuses to generate the value of the virtual bit; and
   a virtual word comprising the plurality of virtual bits, wherein the microprocessor is configured to perform Boolean operations on the values read from the plurality of physical fuses in order to determine a current value of the virtual word, to compare each bit of the virtual word to each bit of the new value being written by the instruction, and to blow at least one unblown fuse of the plurality of physical fuses to change the current value of the virtual word to the new value specified by the instruction when the new value is different than the current value of the virtual word.

* * * * *